Aug. 19, 1952 J. C. VAN ARSDELL, JR 2,607,821

ELECTRIC CIRCUIT ASSEMBLY

Filed Feb. 5, 1949

INVENTOR.

BY John C Van Arsdell Jr

Ralph Hammar
Attorney

Patented Aug. 19, 1952 2,607,821

UNITED STATES PATENT OFFICE 2,607,821

ELECTRIC CIRCUIT ASSEMBLY

John C. Van Arsdell, Jr., Erie, Pa., assignor to Erie Resistor Corporation, Erie, Pa., a corporation of Pennsylvania Application February 5, 1949, Serial No. 74,795

4 Claims. (Cl. 173—324)

In electric circuits for radio and the like, the circuit impedance components such as resistors and condensers have been connected by hand soldered connections. This invention is intended to eliminate some of the hand soldering. In a preferred form, a network of circuit components is assembled as a unit with the circuit interconnections made as part of the assembly operation so that only the leads from the assembly require hand soldering. Use is made of a support of insulating material to which solder will not adhere carrying solder adherent metal coatings making connections to lead wires and circuit interconnections between the lead wires. The lead wires extend through the support and over the terminals of the circuit components to mechanically clamp the components to the support. By dipping the support in solder, soldered connections are made between the leads and the coatings and between the leads and the circuit component terminals. Unwanted leads may now be removed and the assembly dipped in a protective coating. This method eliminates hand soldering of the leads to the terminals of the circuit components and to the circuit interconnections between the components. Further objects and advantages appear in the specification and claims.

Figure 1:
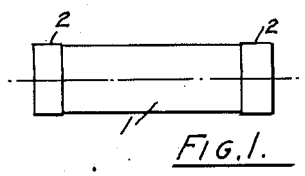
Figure 2:
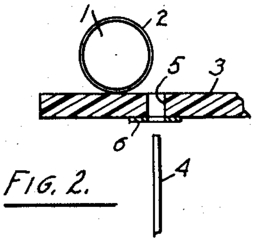
Figure 3:
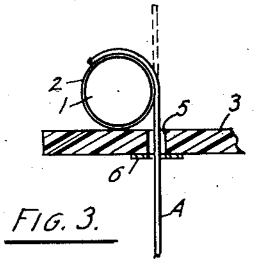
Figure 4:
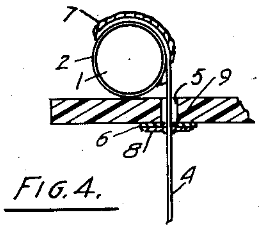
Figure 5:
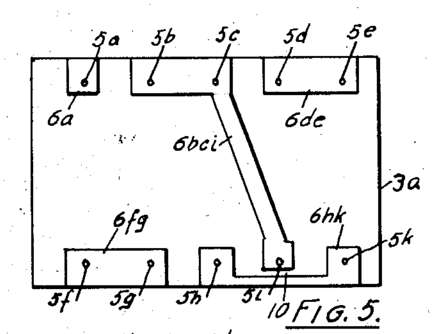
Figure 6:
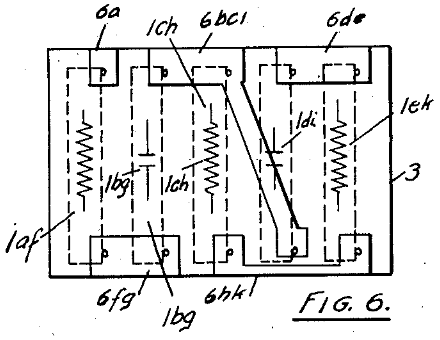
Figure 7:
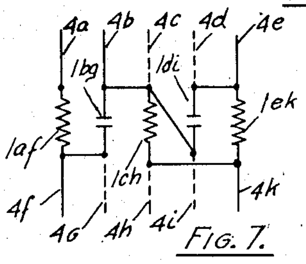
Figure 11:
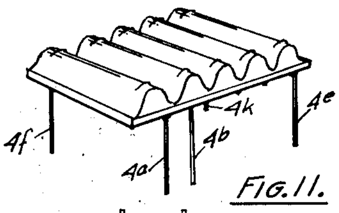
Figure 8:
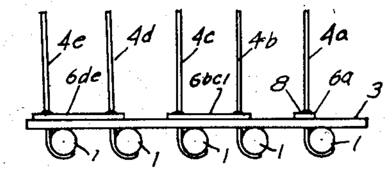
Figure 9:
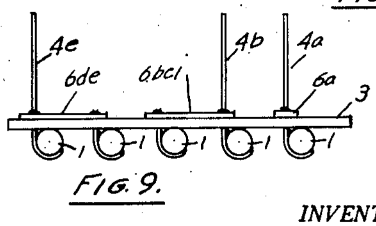
Figure 10:
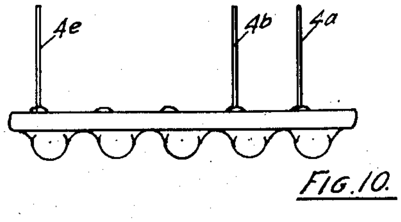

In the drawings Fig. 1 is a view of one of the electrical circuit components; Fig. 2 is a diagrammatic view showing the assembly of one of the circuit components on its support; Fig. 3 is a view showing the circuit component assembled on its support; and Fig 4 is a view of the circuit component after the soldering operation; Fig. 5 is a bottom plan view of the support for a multiple unit assembly; Fig. 6 is a view similar to Fig. 5 showing a typical multiple unit assembly; Fig. 7 is an electric wiring diagram for the assembly shown in Fig. 6; Fig. 8 is an edge view of the assembly after the soldering operation; Fig. 9 is a view similar to Fig. 8 with the unwanted leads cut off; Fig. 10 is a view similar to Fig. 8 after the assembly has been dipped in an insulating compound; and Fig. 11 is a perspective of the finished assembly.

In Fig. 1 is shown a typical electric circuit impedance component having a body 1 at each end of which is a terminal 2. If the component is a resistor the body will ordinarily be molded of resistance material and the terminals 2 will be copper coatings sprayed on the ends of the body. If the circuit component is a condenser the body may be a tubular ceramic and the terminals 2 may be silver coatings fired or metallized to the ceramic. In either of these typical constructions the terminals 2 are of solder adherent metal mounted on a body to which solder does not adhere.

The assembly of the circuit component is diagrammatically shown in Figs. 2, 3, and 4. In the first step the circuit component is placed against one face of a base 3 of insulating material and a lead 4 is fed through an opening 5 in the base so that its upper end extends to the dotted line position shown in Fig. 3. The upper end is then bent down over the terminal 2 so that the lead in effect holds or clamps the terminal against the base and positions or temporarily anchors the circuit component. On the underside of the base 3 is a metal coating 6 of solder adherent metal such as sprayed copper which is adjacent the opening 5 and may extend between openings for leads which are to be electrically connected. After the assembly has reached the stage shown in Fig. 3 flux is applied to the lead and to the adjacent surfaces of the terminal 2 and of the coating 6 and the assembly is immersed in molten solder which adheres to the lead terminal and coating making soldered connections 7 and 8 but does not adhere to the base 3 or to the body 1 of the circuit component. This means that no particular care is required in making the soldered connection 7 and 8. The soldered connection 8 which is on the under or opposite side of the circuit components serves both to mechanically anchor the lead wire 4 to the base and also to make an electrical connection between the lead wire and the adjacent coating 6. The mechanical anchoring is increased by the solder 9 which flows along the lead wire into the opening 5.

All of the operations in the assembly of the circuit component on its base are adapted to automatic operation. The lead wires 3 are readily fed through the registering openings 5 in the base 3. The positioning of the circuit components on one face of the base and the temporary anchoring or positioning of the component on the base by bending the lead wire over the component terminal 2 is an operation which is adapted to automatic machinery. After the positioning of the circuit component on the base the subsequent soldering operation is of the sort adapted either to automatic operation or to simple hand operations.

In Figs. 5 through 11 inclusive is shown a multiple unit assembly useful in radio circuits. This assembly has a base 3a with equally spaced openings 5a, 5b, 5c, 5d, and 5e along one edge and 5f, 5g, 5h, 5i, and 5k along the other edge for receiving correspondingly lettered lead wires 4. On the under side of the base are sprayed copper coatings which serve to make electrical connections to the lead wires and also electrical connections between the lead wires which are to be connected. These coatings comprise a coating 6a around the opening 5a; a coating 6bci around the openings 5b, 5c, and 5i and extending between these openings; a coating 6de around and between the openings 5d and 5e; a coating 6fg around and between the openings 5f and 5g; and a coating 6hk around and between the openings 5h and 5k. The coating 6hk extends past one end of the coating 6bci there being a space 10 therebetween so that there is no danger of the solder short circuiting or connecting the coating 6bci with the coating 6hk. On the upper side of the base 3a are electrical circuit components having the structure shown in Fig. 1. These components comprise a resistor 1af extending between the openings 5a and 5f; a condenser 1bg extending between the openings 5g and 5b; a resistor 1ch extending between the openings 5c and 5h; a condenser 1di extending between the openings 5d, 5i; and a resistor 1ek extending between the openings 5e and 5k. It will be understood that no particular significance is attached to the fact that these components are resistors or condensers. That is merely the requirement of the particular assembly illustrated.

The electrical diagram for the circuit assembly shown in Fig. 7 makes clear the function of the assembly. In this diagram the leads 4a, 4b, 4e, 4f and 4k which are used to connect the assembly to its circuit are shown in full lines while the unnecessary leads 4c, 4d, 4g, 4h and 4i are shown in dotted lines. These unnecessary or unwanted leads may be cut off after the completion of the assembly operation so that only the necessary leads will remain for use in connecting the assembly.

It will ordinarily be more convenient to keep the leads the full length during the assembly operation and to cut off the unwanted leads after soldering. Fig. 8 is an edge view of the assembly after the soldering operation in which all of the leads are in place. Fig. 9 is a view similar to Fig. 8 in which the unwanted leads 4c and 4d have been cut off directly above the soldered connections between these leads and the coating 6bci and 6de. Having all of the leads of the same length and postponing the severing of the unwanted leads until after the soldering operation permits the use of the same machinery for the assembly of a wide variety of circuit combinations in which there are many different arrangements of resistors and condensers. The unwanted leads do not interfere with the soldering operation and in fact may provide a more convenient means for holding the assembly and dipping the edges of the assembly in solder. By having the lead wires arranged along the edges of the assembly only the edges need by dipped in solder. Dipping the edges minimizes the heat shock which may produce stresses cracking ceramic condensers.

After the completion of the soldering operation and the removal of the unwanted terminals the entire assembly, with the exception of the projecting leads for making the connections into the circuit, is dipped in an insulating compound which upon drying forms a protective coating over the connections and over the circuit components.

In effect the entire assembly is sealed in the insulating compound.

What I claim as new is:

1. In combination, a base of insulating material having an opening therein, a leadless electric circuit impedance component having a body with a terminal surface of solder adherent metal of suitable area for soldering of a lead thereto, said component being positioned with the terminal on one face of the base adjacent the opening, a lead of solder adherent metal extending through the opening and over and engaging the terminal and clamping the component to the base, a solder adherent metal coating on the opposite face of the base adjacent the opening, and soldered connections between the lead and the terminal and coating.

2. In combination, a base of insulating material having a plurality of pairs of spaced openings therein, a plurality of leadless electric circuit impedance components positioned on one face of the base, each of the components having a body extending between the spaced openings of each pair and each body having spaced terminal surfaces of solder adherent metal of suitable area for soldering a lead thereto adjacent the respective openings, leads of solder adherent metal extending through the openings and over and engaging the terminals and clamping the components to the base, solder adherent metal coatings on the opposite face of the base adjacent the leads and extending between leads which are to be electrically connected, and soldered connections between the leads and the terminals and coatings.

3. In combination, a base of insulating material having pairs of spaced openings therethrough for receiving lead wires, solder adherent coatings on one face of the base adjacent the openings and between openings for leads which are to be electrically connected, lead wires extending through the openings and having portions projecting beyond the opposite face of the base, leadless electrical circuit impedance components on the opposite face of the base, each of the components having a body extending between the spaced openings of each pair and each body having spaced terminal surfaces of solder adherent metal of suitable area for soldering a lead thereto underlying and in engagement with the projecting portions of the lead wires and being clamped thereby against the base, and soldered connections between the lead wires and the terminals and coatings.

4. In combination, a base of insulating material having a series of at least three openings therein spaced along one edge, leadless electric circuit impedance components on one face of the base, each of the components having a body with a terminal surface of solder adherent metal of suitable area for soldering a lead thereto, and each of the components having its body positioned on one face of the base with its terminal surface adjacent one of the openings, leads of solder adherent metal extending through the openings and over and engaging the terminals to clamp the components to the base, solder adherent metal coatings on the opposite face of the base adjacent the openings, a metal coating extending along said one edge of the base between two of the first mentioned metal coatings and extending past and in spaced relation to one of the first mentioned metal coatings intermediate said two metal coatings, and soldered connections between the leads and the terminals and the adjacent coatings.

JOHN C. VAN ARSDELL, JR.

REFERENCES CITED

The following references are of record in the file of this patent:

UNITED STATES PATENTS

| Number | Name | Date |
|---|---|---|
| 2,046,129 | Mucher | June 30, 1936 |
| 2,046,669 | Wood | July 7, 1936 |
| 2,066,876 | Carpenter et al. | Jan. 5, 1937 |
| 2,250,940 | Zahn | July 29, 1941 |
| 2,264,703 | Lenz | Dec. 2, 1941 |
| 2,270,166 | Hiensch | Jan. 13, 1942 |
| 2,427,417 | Prickett | Sept. 16, 1947 |
| 2,433,384 | McLarn | Dec. 30, 1947 |
| 2,441,960 | Eisler | May 25, 1948 |
| 2,466,192 | Wood | Apr. 5, 1949 |